United States Patent
Herring et al.

(10) Patent No.: US 8,307,486 B2
(45) Date of Patent: Nov. 13, 2012

(54) AIR VENT DUST SCRUBBER

(75) Inventors: Dean F Herring, Youngsville, NC (US);
Jason A. Matteson, Releigh, NC (US);
Robert A. Myers, Cary, NC (US);
Philip M. Woodward, Cary, NC (US)

(73) Assignee: International Business Machines Corporation, Armonk, NY (US)

( * ) Notice: Subject to any disclaimer, the term of this patent is extended or adjusted under 35 U.S.C. 154(b) by 1159 days.

(21) Appl. No.: 12/172,057

(22) Filed: Jul. 11, 2008

(65) Prior Publication Data
US 2010/0006126 A1  Jan. 14, 2010

(51) Int. Cl.
*A47L 3/00* (2006.01)

(52) U.S. Cl. .................. 15/3; 454/184; 454/254

(58) Field of Classification Search ........... 15/3, 93.1; 454/141, 256, 274, 296, 298, 334
See application file for complete search history.

(56) References Cited

U.S. PATENT DOCUMENTS

| | | | |
|---|---|---|---|
| 2,807,992 A * | 10/1957 | Ehman | 454/284 |
| 4,006,033 A | 2/1977 | Schewe | |
| 4,737,172 A | 4/1988 | Halder | |
| 4,861,178 A | 8/1989 | Reed | |
| 4,907,543 A | 3/1990 | Matranga et al. | |
| 4,971,026 A | 11/1990 | Fineblum | |
| 6,007,607 A | 12/1999 | Becker et al. | |
| 6,302,785 B1 * | 10/2001 | McKinney et al. | 454/334 |
| 6,342,004 B1 | 1/2002 | Lattimore et al. | |
| 6,579,091 B1 | 6/2003 | Simonen | |
| 6,694,564 B2 | 2/2004 | Hospital | |
| 6,851,156 B1 | 2/2005 | Hairaton | |
| 2005/0108996 A1 | 5/2005 | Latham et al. | |
| 2006/0240765 A1 * | 10/2006 | Cheng | 454/334 |

FOREIGN PATENT DOCUMENTS

| | | |
|---|---|---|
| JP | 2000-151168 | 5/2000 |
| JP | 2006-2395 | 1/2006 |
| JP | 2006-239509 | 9/2006 |

* cited by examiner

*Primary Examiner* — Steven B McAllister
*Assistant Examiner* — Jamil Decker
(74) *Attorney, Agent, or Firm* — Dianoosh Salehi

(57) ABSTRACT

An assembly used to scrape clean a vent pattern with a blade and catch or the scrapings.

1 Claim, 2 Drawing Sheets

AIR VENT DUST SCRUBBER

FIELD OF THE INVENTION

The invention relates generally to computer systems and more specifically to removal of dust and debris from airflow vents that are part of an enclosure, such as a monitor, computer and the like.

RELATED ART

Typically, in many computer systems that rely on airflow through external vents for cooling, adequate airflow may be interrupted by dust and other debris that may accumulate on the external vents. Fans are typically used to cool down the internal components of the computer systems, however, if not enough air flows through the external computer vents to contact the internal components, then the CPU may overheat and shutdown.

There is currently not a simple way to remove dust from the vent pattern of a computer in such a way that ensures that the proper airflow is being allowed through the vent.

SUMMARY

The present invention provides an assembly used to scrape clean a vent pattern with a blade and catch or filter the scrapings.

In one aspect, an enclosure is provided having an external vent substrate having a vent opening to allow air to come into the enclosure along with internal fans to blow the air out of the enclosure to refresh the stale air inside the enclosure with air from outside the enclosure. In the process the vent patterns may become clogged with dust.

An air vent cleaning mechanism is provided which includes a blade positioned parallel to and lying substantially on a first side of the vent substrate. The blade is moveable parallel to the first side of the vent substrate over the vent opening.

The invention also includes a debris catching mechanism positioned parallel to and lying substantially on a second side of the vent substrate opposite the blade. The debris catching mechanism is movable parallel to the second side of the vent substrate over the vent opening, and independently of the blade.

The debris catching mechanism includes a free hole area, which is positionable in line with the vent opening to allow free flowing air to move through the vent opening.

A sensor is provided for determining when air flow through the vent opening has reached a predetermined rate. The sensor is configured to provide a signal to cause the debris catching mechanism to move from a home position away from the vent opening to a deployed position over the vent opening and to cause the blade to move from a home position away from the vent opening to a deployed position over the vent opening. The movement of the blade causes dust or debris on an edge of the vent opening to be scraped off and captured by the debris catching mechanism.

The objects and features of the present invention, which are believed to be novel, are set forth with particularity in the appended claims. The present invention, both as to its organization and manner of operation, together with further objects and advantages, may best be understood by reference to the following description, taken in connection with the accompanying drawings.

BRIEF DESCRIPTION OF THE DRAWINGS

The foregoing features and other features of the present invention will now be described with reference to the drawings. In the drawings, the same components have the same reference numerals. The illustrated embodiment is intended to illustrate, but not to limit the invention. The drawings include the following Figures.

DETAILED DESCRIPTION

Figure 1A:
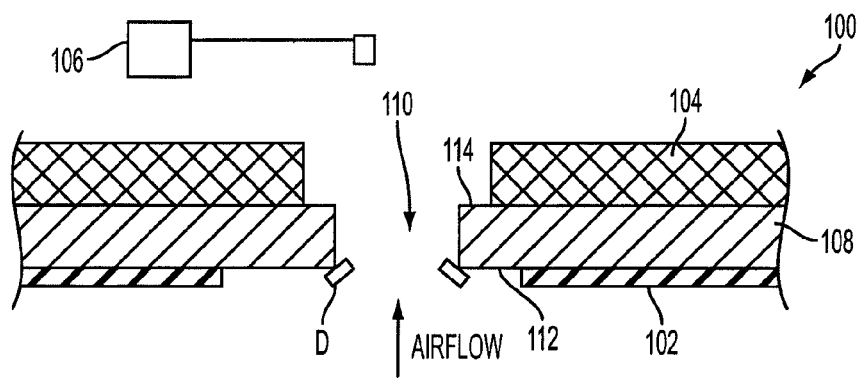
FIGS. 1A-1E are simplified sectional views illustrating the operation of the vent dust scrubber in accordance with an embodiment of the present invention.

FIG. 1A is a sectional view of an air vent cleaning or scrubbing mechanism 100 in accordance with an embodiment of the present invention. Cleaning mechanism 100 includes a blade or scrapper 102, debris catching mechanism 104, and an air flow sensor 106.

Cleaning mechanism 100 is to be used on an enclosure, such as a computer enclosure and the like that includes a vent substrate 108 having a vent pattern that defines slits or holes 110 to allow air to flow into and out from the enclosure. Vent substrate is typically made of plastic or sheet metal. In most instances, the enclosure may include internal fans used to blow air out from the enclosure to refresh the air inside the enclosure with the air from outside of the enclosure. During this air exchange process, holes 110 on vent substrate 108 may become clogged with dust and debris particles D.

Referring now to FIGS. 1B-1E, in operation the vent pattern on vent substrate 108 includes slits or holes 110 of a first dimension. Blade 102 having a larger dimension so as to be able to cover a vent opening or hole 110 or a plurality of vent openings or holes 110, may be positioned parallel to and lying substantially on a first side 112 of vent substrate 108. Blade 102 is configured to move parallel to a surface of first side 112 of vent substrate 108. Movement of blade 102 may be manual or automatic. Automatic movement of blade 102 may be accomplished using any type of known linear motion technique or device.

Debris catching mechanism 104, such as a filter and the like, may be positioned on second side 114 of vent substrate 108 from blade 102. Debris catching mechanism 104 is configured to move parallel to second side 114 of vent substrate 108 and independently of blade 102.

Figure 1B:
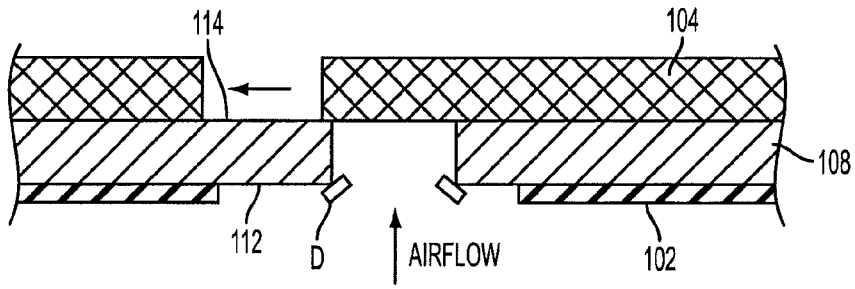

In operation as shown in FIG. 1B, a sensor 106, such as an airflow monitor, provides a signal when the vent flow capacity through vent substrate 108 reaches a predetermined rate. Typically, the signal is in response to the predetermined rate representing a diminished capacity. Cleaning mechanism 100 is activated in response to the signal and debris catching mechanism 104 is moved into a position over vent opening 110 on second side 114 of vent substrate 108. Debris catching mechanism 104 may include a free hole area, such as netting and the like that allows air to continue to flow through vent substrate 108 even when debris catching mechanism 104 is placed in line with vent opening 110.

Figure 1C:
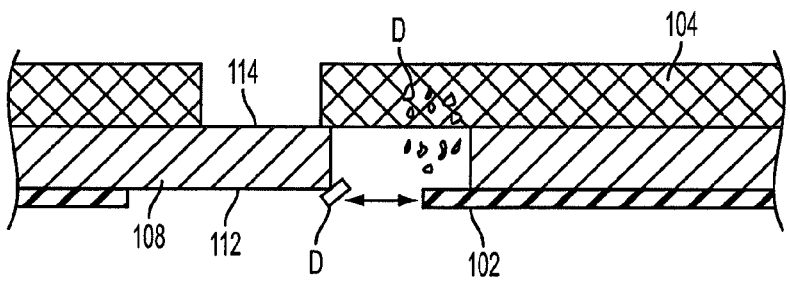
Figure 1D:
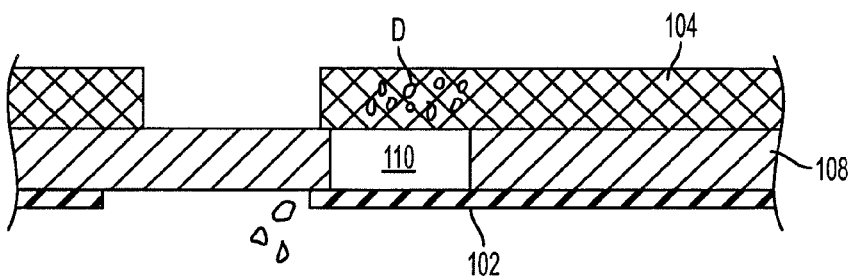
Figure 1E:
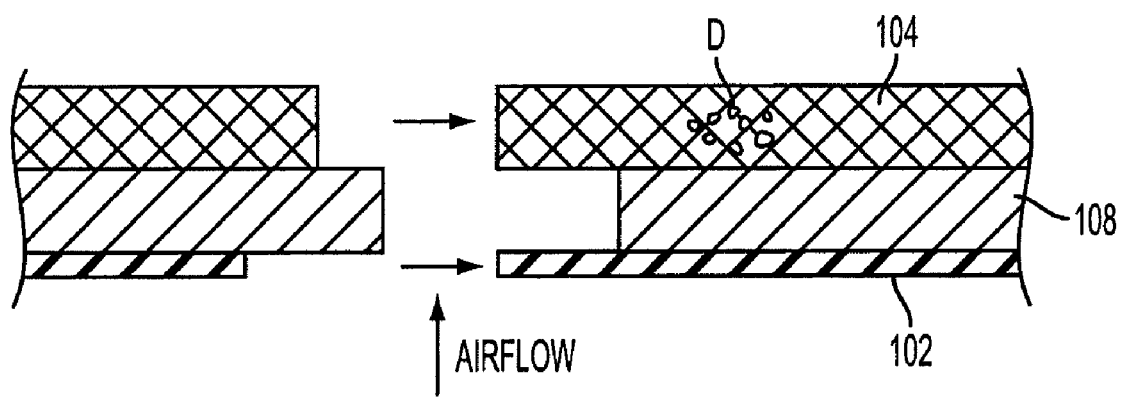

As shown in FIGS. 1C and 1D, once debris catching mechanism 104 is in position, blade 104 is activated into action to scrape off any dust D accumulated on the edges of vent opening 110. In one embodiment, blade 102 may be moved back and forth in a scrubbing action. Dust and debris particles D that are loosened by the process are "sucked" into debris catching mechanism 104.

As shown in FIG. 1D, after the blade action is stopped, debris catching mechanism 104 may be retracted to allow for the free flow of air through vent opening 110.

After the process is completed or as desired, debris catching mechanism 104 may be cleaned or replaced by user interaction. The user may be made aware of the need to replace debris catching mechanism 104 using a computer having an LED that signals that it has processed a vent cleaning event.

The invention has been disclosed in an illustrative manner. Accordingly, the terminology employed throughout should be read in an exemplary rather than a limiting manner. Although minor modifications of the invention will occur to those of ordinary skill in the art, it shall be understood that what is intended to be circumscribed within the scope of the patent warranted hereon are all such embodiments that reasonably fall within the scope of the advancement to the art hereby contributed, and that scope shall not be restricted, except in light of the appended claims and their equivalents.

What is claimed is:

1. An air vent cleaning mechanism comprising:
   a blade positioned parallel to and lying substantially on a first side of a wall having a vent opening, the blade moveable parallel to the first side of the wall over the vent opening for cleaning dust or debris from an edge of the vent opening;
   a debris catching mechanism positioned parallel to and lying substantially on a second side of the wall opposite the blade, the debris catching mechanism movable parallel to the second side of the wall over the vent opening, and independently of the blade, wherein the debris catching mechanism includes an aperture being positionable in line with the vent opening to allow free flowing air to move through the vent opening; and
   a sensor for determining when air flow through the vent opening has reached a predetermined rate, the sensor configured to provide a signal to cause the debris catching mechanism to move from a home position away from the vent opening to a deployed position over the vent opening and to cause the blade to move from a home position in which the aperture is aligned with the vent opening to a deployed position over the vent opening, the movement of the blade causing the dust or the debris on the edge of the vent opening to be scraped off and captured by the debris catching mechanism.

* * * * *